METHOD OF DIFFUSING IMPURITIES INTO SELECTED AREAS OF A SEMICONDUCTOR

Filed May 11, 1970

INVENTOR.

Clark L. Ashton

Robert G. Hays

BY Ronald C. Pennell

Mueller and Aichele

ATTY'S

United States Patent Office 3,681,154

Patented Aug. 1, 1972

3,681,154

METHOD OF DIFFUSING IMPURITIES INTO SELECTED AREAS OF A SEMICONDUCTOR

Clark L. Ashton and Robert G. Hays, Scottsdale, and Ronald C. Pennell, Mesa, Ariz., assignors to Motorola, Inc., Franklin Park, Ill.

Filed May 11, 1970, Ser. No. 36,310
Int. Cl. H01l 7/36
U.S. Cl. 148—187 22 Claims

ABSTRACT OF THE DISCLOSURE

A method of diffusing an N or P type dopant into a semiconductor body and a method of selectively diffusing an N or P type dopant into a semiconductor body by carrying out, in selected areas, a localized chemical reaction involving the halide of the dopant and the semiconductor material. Localization, using a silicon dioxide mask having windows therein, formed by photolithographic techniques, is achieved with germanium and P type dopants such as aluminum, gallium and indium by carrying out the displacement reaction between germanium and the trichloride of the dopant in a reducing ambient such as hydrogen at a temperature below the melting point of germanium and at substantially atmospheric pressure.

BACKGROUND OF THE INVENTION

This invention relates to methods for diffusing impurities, from the vaporous phase, into semiconductors, to methods for localizing the areas of diffusion, and particularly to the localization of aluminum, gallium and indium vaporous diffusions into germanium to form junctions and it is an object of the invention to provide improved methods of this nature.

Because of higher carrier mobilities in germanium semiconductors as compared with silicon semiconductors, germanium is a much preferable material for making high frequency diodes, transistors and other junction devices. Ultra high frequency devices require ultra-small geometry diffusions into germanium including the base width. Particularly the lateral dimensions of the emitter and the depth of its diffusion into the base are important to the satisfactory operations of ultra high frequency transistors of the mesa, planar, annular and other types. In such devices the lateral dimensions of the emitter are of the order of several microns and the depth of the emitter diffusion may be of the order of a micron or less.

In the case of silicon junction devices the use of a silicon dioxide mask formed on the silicon substrate, in combination with the use of photolithographic techniques, has enabled the selective diffusion, from the solid state, of any of the usual N type dopants and boron as a P type dopant as emitters and bases. Thus, high frequency planar transistors and integrated circuits utilizing silicon as a starting material have become common.

However, the frequency response of silicon devices is limited by their carrier mobility. Germanium, inherently, has a much higher carrier mobility than silicon. Consequently, germanum devices can operate at frequencies two to three times greater than silicon devices. Also, germanium devices have a much higher signal to noise ratio than silicon devices.

Heretofore, silicon dioxide has not been a good mask for the other P type dopants of aluminum, gallium and indium whether used on a silicon or a germanium substrate. No other simple or satisfactory mask has been known for these dopants.

Consequently, germanium technology lagged behind that of silicon despite the fact that germanium has superior qualities for high frequency junction devices because of its substantially greater carrier mobility.

It is an object of the invention to provide an improved method and/or means for diffusing a dopant into a semiconductor body or into selected areas of the semiconductor body.

It is a further object of the invention to provide an improved method and/or means for selectively diffusing a dopant in a vapor state utilizing a silicon dioxide mask.

It is a further object of the invention to provide an improved method and/or means for selectively diffusing a dopant into a semiconductor body by carrying out a localized chemical displacement reaction between the semiconductor material and the dopant in a vaporous state.

Utilizing the chemical displacement reaction, it is feasible to diffuse dopants into semiconductor materials and localizing the reaction, as by an easily formed silicon dioxide mask, it is now feasible to simply and preferentially diffuse aluminum, gallium and indium in controlled geometries on germanium and other semiconductor materials, and to avoid the deposition of these materials on the surface of the mask. The mesa and planar technology with its many inherent advantages is thus available to the art for R.F. power germanium devices, germanium integrated circuits and ultra-small geometry germanium devices.

Prior art attempts at solution have been made. In Pat. No. 3,028,655, Dacey et al., a mask (by unspecified known techniques) is used to selectively deposit, as an emitter, evaporated aluminum on a diffused base layer in a germanium substrate, the evaporated aluminum being subsequently alloyed to the germanium. In Pat. No. 3,354,008, Brixey, Jr. et al., diffusion occurs from a doped silicon dioxide layer which is deposited on a germanium wafer. Assertedly, a mask is not needed and is not shown. Neither is an emitter diffusion although reference is made thereto. In Patent No. 3,372,067, Schafer, a layer of silicon is first deposited on the germanium surface and a portion of the silicon is oxidized to form a mask. After a window is etched into the oxide layer in the usual manner, a base diffusion of boron is made through the window, through the silicon and into the germanium. It is to be noted, firstly, that silicon dioxide is impervious to boron. After the base diffusion a further oxidation of the silicon takes place, a window is opened, an emitter diffusion of an N type impurity such as phosphorus is made. The diffusion takes place through the remaining silicon.

Secondly, silicon dioxide also is a mask for phosphorus. The evaporation of aluminum for contacts does not raise the problem solved by the subject invention. In Pat. No. 3,397,450, Bittmann et al., a localized metal plating reaction is carried on in the areas masked by silicon oxide. In Pat. No. 3,408,238, Sanders, masking against indium, gallium and aluminum is achieved, allegedly, by using a mask of $SiO_2$ and $P_2O_5$. Some phosphorus diffusion into the germanium may take place from this process. It is also a two step process. The Pat. No. 3,431,636, Granberry et al., dealing with the problem of masking germanium discloses a complex series of process steps including the forming and reforming of germanium oxide under the silicon oxide layer. The emitter is formed by evaporating an aluminum film containing small quantities of antimony or arsenic and gallium or indium or both, and subsequently alloying it to the germanium.

SUMMARY OF THE INVENTION

In carrying out the invention in one form, there is provided a method of diffusing, by a localized chemical reaction in a selected area, a diffusant into a semiconductor material selected from the group consisting of germanium, silicon and the Group 3–Group 5 compounds which comprises the steps of providing a substrate of one of said semiconductor materials, forming a coating impervious to the reaction on the surface of said substrate which exposes the selected areas, and subjecting the coated substrate and its selected areas to the action of vaporous diffusant halide, selected from the group of chloride, bromide and iodide, in a reducing ambient in a reaction chamber at a temperature below the melting point of the semiconductor and at essentially atmospheric pressure.

More specifically, the invention may be carried out by diffusing from a localized chemical reaction in a selected area, aluminum dopant into germanium comprising the steps of providing a substrate of germanium, forming a silicon dioxide coating on the surface of the substrate which exposes selected areas thereof, and subjecting the coated substrate and selected areas to the action of vaporous aluminum trichloride or aluminum tribromide in an ambient of hydrogen in a reaction chamber at a temperature in the range of 600°–875° C. and at substantially atmospheric pressure. If the reaction is not to be localized, that is, the reaction is to be carried out over the whole surface, the silicon dioxide coating is eliminated.

DESCRIPTION OF THE PREFERRED EMBODIMENTS

Figure 1:
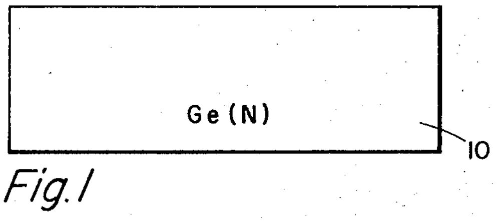
FIG. 1 is an elevational view, on a greatly enlarged scale, of a wafer of N type germanium, one form of starting material, according to the invention.

Referring to the drawings, there is shown a starting material such as a substrate or wafer 10 of N type germanium, for example. Typically, the wafer may be of the order of one hundred to two hundred and fifty microns in thickness and have a resistivity of one-tenth to fifteen hundredths ohm-centimeter. Other thicknesses and resistivities may, of course, be used.

Using known techniques, a layer of silicon dioxide 11 of about one-tenth to one micron in thickness, typically, is deposited, as in a reaction chamber 12. Other thicknesses of layer 11 may be used. Those skilled in the art may desire various other thicknesses for various applications.

The reaction chamber 12 may be of a well known type and may comprise a quartz tube or cylinder 13 into which is placed a graphite carrier or boat 14 which is silicon carbide or quartz sheathed and on which are positioned a number of wafers 10. A high frequency induction heating coil 15 surrounds the tube 13 for bringing the temperatures of the wafers up to one in the range of 350° C. to 600° C., preferably 600° C. in one example. The tube 13 is sealed at one end 16 to a source of gases for the deposition reaction and is vented to the atmosphere at the other end 17.

Silane gas, $SiH_4$, along with an ambient of hydrogen, and oxygen as an oxidant are supplied to the interior of the tube 13. Silicon dioxide, $SiO_2$, forms on the top surface of the wafers 10 to the thickness desired which is dependent on the ultimate definition desired in the mask, the residence time of the wafer in the chamber being about five to ten minutes.

The reaction proceeds according to the formula $$SiH_4 + O_2 \xrightarrow{400^\circ\text{ C.}-600^\circ\text{ C.}} SiO_2 + H_2O$$

Other ambients such as helium, argon, and nitrogen may be used, and other oxidants such as nitrous oxide and carbon dioxide along with hydrogen may be used. The gas pressure inside of the chamber is substantially at atmosphere.

After the silicon dioxide layer 11 has been formed, windows 18 are formed therein, as is well known, by the photolithographic techniques. In this process, a layer of photoresist material (not shown) is deposited on the surface of the layer 11, a mask is applied and the photoresist is exposed, developed and, through the openings in the photoresist mask, an etchant is applied to the layer 11 for an appropriate time until the silicon dioxide, except for the $SiO_2$ mask areas 21, is etched away to form the windows 18. Thereafter, the remaining photoresist material is dissolved away and the wafer with the windows 18 in the $SiO_2$ layer is washed and cleaned and is ready for the next step in the process. All of the foregoing steps for forming windows 18 in the layer 11 are well known and need not be further set forth here.

The remaining areas of silicon dioxide 21 could have a minimum line width of about two and one half microns but could be substantially wider. The minimum dimensions of the windows 18 should be in the range of one half mil by one mil, that is twelve microns by twenty-five microns. Typically, the lateral dimensions of the windows 18 would be of the order of twenty-five microns by twenty-five microns, if square, or twenty-five microns by twelve microns, if rectangular.

Figures 3, 6, 7, 8:
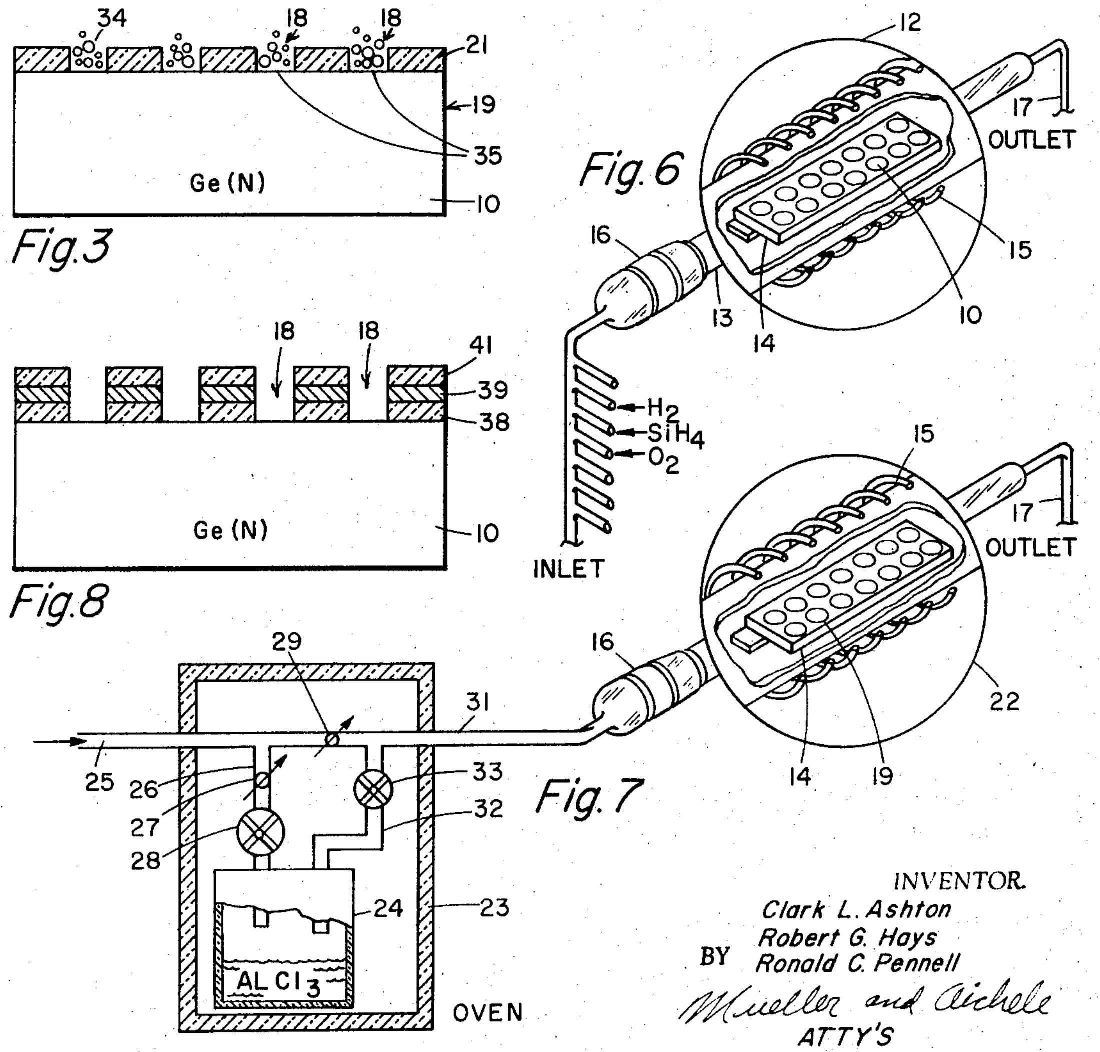
FIG. 3 is an elevational view of the wafer of FIG. 2 with windows formed in the silicon dioxide layer.
FIG. 6 is a diagrammatic view, in perspective, of apparatus for carrying out the localizing mask formation step.
FIG. 7 is a diagrammatic view, partially in perspective, of apparatus for carrying out the diffusion step according to the invention.
FIG. 8 is an elevational view of a germanium wafer with another form of mask formed thereon.

The wafer with its windows 18 may be designated by the reference character 19 and is placed in the reaction chamber 22, FIG. 7, for carrying out the localized chemical reaction in accordance with the invention.

The reaction chamber 22 may be of the same arrangement as reaction chamber 12 of FIG. 6, is connected to the source material by a connection or seal 16 and is vented to the atmosphere at 17. A high frequency heating coil is positioned as described. A boat 14 with the wafers 19 positioned thereon is placed inside of the chamber 22, the source materials supplied and the temperature raised to the desired point.

The atmosphere inside of the reaction chamber 22 consists of $AlCl_3$ vapor in a hydrogen ambient. The mixture of hydrogen and aluminum trichloride vapor is supplied through appropriate piping from an oven 23 which may be of any suitable insulated wall type capable of maintaining a temperature within the range of 100° C. to 190° C., typically about 135° C. The temperature is chosen such that the aluminum trichloride does not deposit in any of the pipes and its desired vapor pressure is attained.

Inside of the oven 23 is a container 24 in which aluminum trichloride as a solid has been placed. Hydrogen gas from any convenient source is supplied through a pipe 25 to the container 24 through a pipe 26, a variable needle valve 27 and a shut-off valve 28. In addition, hydrogen gas is supplied through the variable needle valve 29 and pipe 31 directly to the chamber 22.

The hydrogen gas flowing into the container 24 through pipe 26 picks up aluminum trichloride vapors formed by sublimation which flow through pipe 32 and valve 33 to the pipe 31 where they are carried into the reaction chamber. The pressure inside of the reaction chamber is typically about atmospheric and the high frequency induction coil 15 by susceptor (boat) to a suitable temperature, maintains the wafers 19 at a temperature in the range of 600° C. to 875° C.

In the reaction chamber 12, as well as in the reaction chamber 22 and also the oven 23, temperatures are regulated within about plus or minus one degree centigrade of temperature selected.

The reaction that takes place in the reaction chamber 22 is as follows:

$$Ge + AlCl_3 \xrightarrow{600^\circ C.-875^\circ C.} Al + GeCl_4 + GeCl_2$$

$GeCl_4$ and $GeCl_2$ are gases which pass out the outlet 17.

Diagrammatically shown in FIG. 3 are bubbles 34 which represent the vapors of aluminum trichloride and the hydrogen gas ambient which exist in the windows 18. The aluminum trichloride reacts with the germanium at the surfaces 35 of the wafer, the temperature of the wafers being at 800° C. in the example being described. In the reaction, the aluminum atoms displace germanium atoms at the surfaces 35 of the substrate. The aluminum atoms then diffuse from the surfaces 35 into the bulk or body of the material in a manner well known to the art. For this reaction, the silicon dioxide areas 21 act as a mask by preventing the localized chemical reaction from occurring, and prevent the aluminum atoms from spreading through or underneath the mask except to the depth of the diffusion.

The surface concentration of aluminum atoms at the surfaces 35 during the course of the reaction typically would be between $10^{15}$ and $10^{20}$ atoms per cubic centimeter. The incoming temperature of the source material, $AlCl_3$, must be such as to have enough vapor pressure to give adequate concentration. The surface concentration of the aluminum atoms during the localized reaction was above $5 \times 10^{19}$ atoms per cc. and reached $7.5 \times 10^{19}$ atoms per cc. in the specific example wherein the diffusion was intended to be used as an emitter. The rate of deposition of aluminum atoms on the surfaces 35, giving the needed concentration of aluminum atoms, should not exceed the rate at which the aluminum atoms can diffuse away from the surface and into the germanium. If the surface concentration exceeds the solid solubility of aluminum in germanium, free aluminum metal will be formed which will then diffuse through the silicon dioxide mask and spread underneath it or will form a surface alloy with the germanium neither of which is desired. When the aluminum diffusion is intended to be used as the base portion of a junction device, the concentration of the aluminum atoms can be less than for the emitter.

The ambient, hydrogen in the case of the process as described, must be a reducing ambient in order for the desired deposition reaction to take place as described.

The wafers 19 remain in the reaction chamber 22 for a sufficient length of time to diffuse aluminum to the desired depth which, typically, might be from less than one micron to ten microns depending upon the type of device desired. In the actual example the depth of the diffusion junction was from .94 to 1.1 microns, the time for such a diffusion being about two hours at 800° C. The background resistivity of the N type germanium was between .1 and .15 ohm cm.

Figure 4:
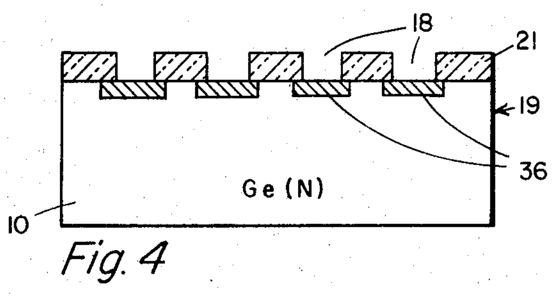
FIG. 4 is an elevational view of the wafer of FIG. 3, following the diffusion, shown in section, of a P type dopant such as aluminum, according to the invention.

In FIG. 4, the wafers 19 are shown after the aluminum diffusions 36, according to the invention, have taken place. It will be noticed that the diffusions have spread underneath the edges of the silicon dioxide masks to about the same extent as the depth of the diffusions.

Since the chemical reaction takes place in the window areas, there is no deposition of metallic aluminum on top of the mask areas. The entire wafer could have been processed without a mask if a continuous diffusion had been desired.

Figure 5:
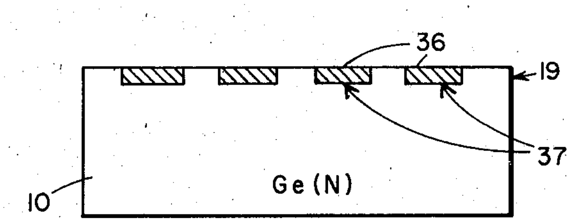
FIG. 5 is an elevational view of the wafer of FIG. 4 following removal of the remaining portions of the silicon dioxide mask.

After the aluminum diffusions have been made as shown in FIG. 4, if desired, the wafer 19 may be subjected to a well known etching process as a result of which the remaining areas 21 of the silicon dioxide mask may be removed. In some applications a complete new layer of $SiO_2$ may be deposited over the wafer before the next processing step is carried out. As shown in FIG. 5, the wafer 19 consists of a substrate 10 of N type germanium and the aluminum diffusions 36 which form P–N junctions at the surfaces 37 as is well understood. Subsequent well known process steps such as attaching terminals may now be performed.

As a further example of carrying out the invention, the localized chemical reaction has been selectively carried out between aluminum tribromide ($AlBr_3$) in a hydrogen ambient at essentially atmospheric pressure. The source temperature (oven 23) was adjusted to provide an aluminum tribromide vapor concentration equal to that in the aluminum trichloride reaction. The reaction took place according to the formula $Ge + AlBr_3 \rightarrow Al + GeBr_4$. Diffusion depths and aluminum surface concentration were the same as found in $AlCl_3$ reaction.

Instead of diffusing aluminum into the windows 18 formed in the silicon dioxide mask, gallium also a P type dopant has been used. The preparation of the germanium wafer to form a silicon dioxide mask with windows 18 therein is the same as already described. In this case, the reaction proceeds according to the formula:

$$Ge + GaCl_3 \xrightarrow{700^\circ C.-875^\circ C.} Ga + GeCl_4$$

the reaction taking place in a reducing ambient such as hydrogen in the same reaction chamber 22 as described. The temperature of the wafers was 800° C., the source temperature of the $GaCl_3$ in the oven 23 was 80° C. and should be in the range of 70° C.–90° C. The background resistivity of the N type germanium was the same as described and the surface concentration achieved of the gallium atoms was $4\text{–}5 \times 10^{20}$ atoms per cc. The depth of the gallium diffusion would be somewhat greater than for aluminum and the time necessary to achieve it was about the same as that for aluminum.

It is believed that the reaction of gallium could proceed according to the formula $$Ge + Ga_2Cl_4 \xrightarrow{Temp.} Ga + GeCl_4$$

under essentially the same parameters and conditions.

Indium, also a P type dopant, it is believed, may be diffused into germanium from the reaction of indium trichloride according to the formula:

$$Ge + InCl_3 \xrightarrow{Temp.} In + GeCl_4$$

The reaction would take place in a hydrogen ambient and would be masked or localized by an $SiO_2$ mask. The temperatures, times and other parameters, as described for aluminum and gallium, are believed would be typical of those to be expected for indium.

In a further example of the invention aluminum was selectively diffused in N type silicon in reaction chamber 22, after windows had been opened in a silicon dioxide mask, according to the reaction $$Si + AlCl_3 \xrightarrow{1000^\circ C.—1200^\circ C.} Al + SiC_4$$

The preferred temperatures of the wafers was in the vicinity of 1100° C. to 1150° C., the ambient was hydrogen gas, and the source temperature of the $AlCl_3$ in the oven 23 was 135° C.

The background resistivity of the silicon was 1–3 ohm-cm., the time of diffusion was one hour at 1100° C., the junction depth was 8–9 microns and the surface concentration of aluminum atoms was $2.5 \times 10^{18}$ atoms per cubic centimeter.

In FIG. 8 the substrate, or wafer 10, of N type germanium is shown with a three layer mask having windows 18 shown therein. The first layer 38 is of silicon dioxide, the second layer 39 is of silicon nitride, $Si_3N_4$, and the third layer 41 is of silicon dioxide. Such a three layer mask will also isolate the local chemical displacement reaction of $AlCl_3$ and germanium according to the invention.

Figure 2:
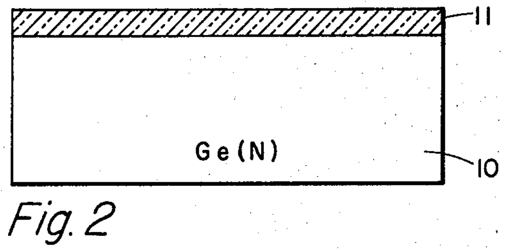
FIG. 2 is an elevational view of the wafer of FIG. 1, with a layer of silicon dioxide, shown in section, deposited thereon.

The layer 38 of $SiO_2$ may be of a thickness comparable to layer 11 of FIG. 2 and is formed in the same way. The middle layer 39 of a thickness comparable to layer 38 is formed in a reaction chamber such as 13 to which are supplied ammonia ($NH_3$) and silane ($SiH_4$) in an ambient of one of hydrogen, nitrogen and argon. The temperature of the wafer 10 is maintained at 900° C., still below the melting point of germanium, and the temperature range may be 750° C. to 900° C. The $SiO_2$ layer 38 is necessary when wafer 10 is of germanium because ammonia and silane, alone or together, or their reaction products, at the temperatures needed, attack germanium. If the wafer 10 is of silicon the $SiO_2$ layer may be eliminated because the reactants do not attack the silicon.

The layer 41 of $SiO_2$ which may be of a thickness comparable to the other layers is deposited in the same manner as layers 38 and 11. The layer 41 is necessary because the $Si_3N_4$ is not amenable to the photoresist masking and etching process to form windows.

After all three layers 38, 39 and 41 are formed, the portions of windows 18 in the $SiO_2$ layer 41 are opened by the usual photoresist masking and hydrofluoric acid based etching solution technique. This etching solution does not attack the $Si_3N_4$ layer 39. At this stage, a phosphoric acid based solution is applied to the layer 39 through the partial windows 18 which etches the windows 18 down to the layer 38 but does not attack it. The layer 38 is then subjected to a hydrofluoric acid based etching solution which completes etching of the windows 18 down to the germanium surface.

In the completed windows 18 of the wafer shown in FIG. 8, the localized chemical displacement reaction is carried on as already described.

The $Si_3N_4$ layer is of further advantage because it is a barrier to any sodium ions which may be present, whereas the silicon dioxide layer is not such a barrier.

While it has been indicated that the localized chemical reaction advantageously takes place on the surface of N type germanium and N type silicon for the P type dopants it is believed that the similar halide reaction, other than fluoride, will take place on the surface of any semiconductor material including P type germanium, P type silicon and the Group 3–Group 5 compounds with either P or N type dopants as desired. The reaction of the halide of the dopant will take place on any of the semiconductor surfaces and will be localized by a silicon dioxide mask in order to form the dopant atoms where the diffusions are desired. The halide of the semiconductor passes off as a gas.

As an example of the Group 3–Group 5 compounds reaction, it is believed that zinc chloride in vapor phase, may be reacted with gallium arsenide as the substrate according to the formula:

$$ZnCl_2+GaAs \xrightarrow{\text{Temp.}} Zn+GaCl_x+AsCl_y$$

The zinc would diffuse into the gallium arsenide surface with gallium chloride and arsenic chloride being given off. This reaction would take place in the reaction chamber 22 under a reducing ambient such as hydrogen, the temperatures, times and other parameters being believed to be of the order already indicated. It is not known with certainty what the precise compositions of the gallium chloride and arsenic chloride are but the subscripts $x$ and $y$ in this case would be some small numbers between 1 and 5.

As a further example of the Group 3–Group 5 compounds reaction it is believed that zinc chloride in vapor phase may be reacted with gallium arsenide phosphide according to the formula:

$$ZnCl_2+GaAs_xP_{1-x} \xrightarrow{\text{Temp.}} Zn+GaCl+GaCl_3 +AsCl_{3\text{ or }5}+PCl_{3\text{ or }5}$$

The reaction parameters would be expected to be about the same as for the zinc chloride case. The subscript $x$ in this case would be between 0 and 1 and would be expected to be about 0.38.

As a still further example of the Group 3–Group 5 compounds reaction, it is believed that tin chloride ($SnCl_4$) in vapor phase may be reacted with gallium arsenide phosphide according to the formula:

$$SnCl_4 + GaAs_xP_{1-x} \xrightarrow{\text{Temp.}} Sn + GaCl + GCl_3 + AsCl_{3\text{ or }5} + PCl_{2\text{ or }5}$$

the reaction parameters and the subscript $x$ being expected to be essentially the same as for the zinc chloride and gallium arsenide phosphide case.

In any of the reactions referred to the temperature of the wafers in the reaction chamber 22 must be such that the substrate material does not melt. The wafer temperature also must be such that the dopant diffuses into the substrate at or faster than the rate of formation of the dopant atoms by the localized chemical displacement reaction. The diffusant-dopant should remain in the gas or vapor phase prior to actual diffusing. Metallic aluminum or gallium, for example, should not be formed, apart from the atoms which are immediately diffused into the substrate because the silicon dioxide mask will not prevent these metals from spreading at the diffusion temperatures.

To control the concentration of the dopant atoms at the diffusion surface, the temperature of the oven in which the dopant chloride vapor is formed is controlled and/or the rate of flow of the hydrogen over the dopant is controlled.

It is necessary that the surface of the germanium, or other semiconductor material, be essentially a mirror surface so that the diffusion front is highly planar. Any roughnesses existing will cause the diffusion to take place in an irregular manner thereby degrading the junctions formed. Moreover, the hydrogen ambient must be very pure. Traces of nitrogen of the order of ten parts per million will degrade the mirror surface, when a halide such as a chloride is present, and will cause erratic diffusions to occur.

While the specific substances utilized have been the chlorides of aluminum and gallium, and the bromide of aluminum, it is believed that the iodides will function equally well and they are within the scope of the invention which includes the class of halides generally. Fluorides are believed to have less probability of functioning adequately due to the high energy of their formation, the low vapor pressures of some fluoride compounds and the increased rate of attack of the fluorides on the $SiO_2$ masks.

The general form of the reaction, according to the invention is $$S + Dh \xrightarrow{\text{Temp.}} D + Sh$$

in which S represents the semiconductor or substrate material, Dh represents the dopant halide, D represents the dopant and Sh represents the semiconductor halide which goes off as a gas in the reaction.

While the horizontal or epitaxial type of reaction chamber has been shown, it will be understood that a diffusion furnace type of reaction chamber may be used.

For deep diffusions in one step, as for example, more than fifteen microns, $SiO_2$ may lose some of its effectiveness as a mask for localized halide displacement reactions. Apparently this is because $SiO_2$ is ultimately attacked by the $H_2$ ambient after a long period of time, reducing it to SiO which volatilizes at temperatures of 1100° C. There may be some halide attack of the $SiO_2$ mask after long periods of time. A second layer of $SiO_2$ can, of course, be deposited.

In the halide reactions described in this application and at the temperatures at which such reactions occur, the reaction products with the semiconductor may include, the tetra, the tri, the di and the mono halide in various proportions. Other such groups including hydrogen may also occur, as for example the germanes and the silanes. Where the reaction product in a particular case is stated to be the tetra halide, and/or the dihalide, for example, it will be understood that this is by way of example only and that other reaction products as indicated may be present. These latter go off as gases and do not affect the desired aspect which is the formation of the dopant in vapor phase which diffuses into the substrate.

While particular examples have been disclosed, it will be understood that other examples will be operative within the scope of the disclosure.

What is claimed is:

1. The method of diffusing a diffusant into a selected area of a semiconductor material selected from the group consisting of germanium, silicon and the Group 3–Group 5 compounds by a localized vapor phase chemical reaction between said semiconductor material and the diffusant halide which comprises the steps of:

providing a substrate of one of said semiconductor materials, forming a coating impervious to said reaction on the surface of said substrate which exposes selected areas thereof, and subjecting said coated substrate and said selected areas to the action of vaporous diffusant halide selected from the group of chloride, bromide and iodide in a reducing ambient in a reaction chamber at a temperature between about 600° C. and less than the melting point of the semiconductor and at essentially atmospheric pressure.

2. The method according to claim 1 wherein the diffusant is a P type dopant and the ambient is hydrogen gas.

3. The method according to claim 1 wherein the diffusant is an N type dopant and the ambient is hydrogen gas.

4. The method according to claim 2 wherein the impervious coating is $SiO_2$.

5. The method according to claim 2 wherein the impervious coating is $Si_3N_4$.

6. The method according to claim 3 wherein the impervious coating is $SiO_2$.

7. The method according to claim 3 wherein the impervious coating is $Si_3N_4$.

8. The method of diffusing aluminum dopant into a selected area of germanium by a localized vapor phase chemical reaction between said germanium and aluminum trichloride which comprises the steps of:

providing a substrate of germanium, forming a silicon dioxide coating on the surface of said substrate which exposes selected areas thereof, and subjecting said coated substrate and selected areas to the action of vaporous aluminum trichloride in an ambient of hydrogen, in a reaction chamber, at a temperature in the range of 600°–875° C. and at essentially atmospheric pressure.

9. The method of diffusing aluminum dopant into a selected area of germanium by a localized vapor phase chemical reaction between said germanium and aluminum tribromide which comprises the steps of:

providing a substrate of germanium, forming a silicon dioxide coating on the surface of said substrate which exposes selected areas thereof, and subjecting said coated substrate and selected areas to the action of vaporous aluminum tribromide in an ambient of hydrogen, in a reaction chamber, at a temperature in the range of 600°–875° C. and at essentially atmospheric pressure.

10. The method of diffusing gallium dopant into a selected area of germanium by a localized vapor phase chemical reaction between said germanium and gallium trichloride which comprises the steps of:

providing a substrate of germanium, forming a silicon dioxide coating on the surface of said substrate which exposes selected areas thereof, and subjecting said coated substrate and selected areas to the action of vaporous gallium trichloride in an ambient of hydrogen, in a reaction chamber, at a temperature in the range of 600°–875° C. and at essentially atmospheric pressure.

11. The method of diffusing indium dopant into a selected area of germanium by a localized vapor phase chemical reaction between said germanium and indium trichloride which comprises the steps of:

providing a substrate of germanium, forming a silicon dioxide coating on the surface of said substrate which exposes selected areas thereof, and subjecting said coated substrate and selected areas to the action of vaporous indium trichloride in an ambient of hydrogen, in a reaction chamber, at a temperature in the range of 600° C.–875° C. and at essentially atmospheric pressure.

12. The method of diffusing a diffusant into a selected area of a semiconductor material selected from the group consisting of germanium, silicon and the Group 3–Group 5 compounds by a localized vapor phase displacement chemical reaction between said semiconductor material and a diffusant halide which comprises the steps of:

providing a substrate of one of said semiconductor materials, forming a coating impervious to said reaction on the surface of said substrate which exposes selected areas thereof, and in said selected areas, carrying out the displacement reaction $S+Dh \rightarrow D+Sh$ with a halogen, in a reducing ambient, at a temperature between about 600° C and less than the melting point of the semiconductor, and at substantially atmospheric pressure.

13. The method according to claim 1 wherein the semiconductor is silicon, the diffusant is a P type dopant, and the ambient is hydrogen gas.

14. The method according to claim 1 wherein the semiconductor is silicon, the diffusant is a N type dopant, and the ambient is hydrogen gas.

15. The method according to claim 1 wherein the semiconductor is germanium, the diffusant is a N type dopant, and the ambient is hydrogen gas.

16. The method according to claim 1 wherein the semiconductor is one of the Group 3–Group 5 compounds, the dopant is zinc, and the ambient is hydrogen gas.

17. The method according to claim 16 wherein the semiconductor is gallium arsenide.

18. The method according to claim 16 wherein the semiconductor is gallium arsenide phosphide.

19. The method according to claim 1 wherein the semiconductor is one of the Group 3–Group 5 compounds, the dopant is tin, and the ambient is hydrogen gas.

20. The method according to claim 19 wherein the semiconductor is gallium arsenide phosphide.

21. The method of diffusing a dopant into a semiconductor material selected from the group consisting of germanium, silicon and the Group 3–Group 5 compounds, by a vapor phase displacement chemical reaction between the vaporous dopant halide and the solid semiconductor substrate, which comprises the steps of:

providing a substrate of one of said semiconductor materials, and subjecting said substrate to the action of vaporous dopant halide selected from the group of chloride, bromide and iodide in a reducing ambient in a reaction chamber at a temperature between about 600° C. and less than melting point of the semiconductor and at essentially atmospheric pressure.

22. The method of diffusing a dopant into a semiconductor material selected from the group consisting of germanium, silicon and the Group 3–Group 5 compounds, by a vapor phase displacement chemical reaction between the vaporous dopant halide and the solid semiconductor substrate, which comprises the steps of:

providing a substrate of one of said semiconductor materials, and carrying out the displacement reaction $S+Dh \rightarrow D+Sh$ with a halogen, in a reducing ambient, at a temperature between about 600° C. and less than melting point of the semiconductor, and at substantially atmospheric pressure.

References Cited

UNITED STATES PATENTS

| | | | |
|---|---|---|---|
| 2,944,975 | 7/1960 | Folberth | 252—62.3 |
| 3,016,313 | 1/1962 | Pell | 148—1.5 |
| 3,162,526 | 12/1964 | Vanik | 148—189 |
| 3,408,238 | 10/1968 | Sanders | 148—187 |
| 3,475,234 | 10/1969 | Kerwin et al. | 148—187 |
| 3,562,033 | 2/1971 | Jansen et al. | 148—189 |

L. DEWAYNE RUTLEDGE, Primary Examiner
J. M. DAVIS, Assistant Examiner

U.S. Cl. X.R.

148—189; 156—17